United States Patent
Kim et al.

(10) Patent No.: US 8,736,163 B2
(45) Date of Patent: May 27, 2014

(54) ORGANIC ELECTRO-LUMINESCENCE DISPLAY DEVICE AND METHOD FOR FABRICATING THE SAME

(75) Inventors: Jeong Hyun Kim, Gyeonggi-do (KR); Choong Keun Yoo, Gyeonggi-do (KR); Heung Lyul Cho, Gyeonggi-do (KR); Joon Suk Lee, Seoul (KR); Jong Seok Moon, Seoul (KR); In Sun Yoo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 703 days.

(21) Appl. No.: 11/824,001

(22) Filed: Jun. 28, 2007

(65) Prior Publication Data

US 2008/0001533 A1 Jan. 3, 2008

(30) Foreign Application Priority Data

Jun. 30, 2006 (KR) .................... 10-2006-0061211

(51) Int. Cl.
*H01L 51/52* (2006.01)
*H01L 51/56* (2006.01)

(52) U.S. Cl.
USPC ............................................. 313/512; 445/25

(58) Field of Classification Search
CPC ............. H01L 51/524; H01L 51/5246; H01L 27/3251
USPC ............... 313/512, 504; 257/100; 445/25
See application file for complete search history.

(56) References Cited

U.S. PATENT DOCUMENTS

| | | | | |
|---|---|---|---|---|
| 4,547,456 A | * | 10/1985 | Kojima et al. | 430/330 |
| 4,654,965 A | * | 4/1987 | Uehara et al. | 29/830 |
| 6,737,176 B1 | * | 5/2004 | Otsuki et al. | 428/690 |
| 6,744,197 B2 | * | 6/2004 | Park et al. | 313/504 |
| 6,784,612 B2 | * | 8/2004 | Park et al. | 313/512 |
| 2002/0021089 A1 | * | 2/2002 | Kim | 313/506 |
| 2003/0168966 A1 | * | 9/2003 | Kobayashi et al. | 313/495 |
| 2003/0170493 A1 | * | 9/2003 | Chen et al. | 428/690 |
| 2004/0051445 A1 | * | 3/2004 | Adachi | 313/504 |
| 2004/0090170 A1 | | 5/2004 | Cha et al. | |
| 2004/0135496 A1 | * | 7/2004 | Park et al. | 313/504 |

(Continued)

FOREIGN PATENT DOCUMENTS

CN 1446032 A 10/2003
CN 1472992 A 2/2004

(Continued)

OTHER PUBLICATIONS

Office Action issued in corresponding German Patent Application No. 10 2007 034 773.3-53; issued Oct. 31, 2008.

(Continued)

*Primary Examiner* — Karabi Guharay
(74) *Attorney, Agent, or Firm* — Brinks Gilson & Lione (57) ABSTRACT

An organic electro-luminescence display device and a method for fabricating the same are provided. A first substrate and a second substrate are sealed by a sealant. An organic electro-luminescent diode is formed on the first substrate. The sealant contains a frit glass and a light-heat converter. The frit glass can reduce the moisture and oxygen transmission rate by preventing the organic electro-luminescent diode from being thermally decomposed during a curing process. Since the two substrates are encapsulated by the frit glass, the lifetime and reliability of the organic electro-luminescence display device can be increased.

10 Claims, 10 Drawing Sheets

(56) References Cited

U.S. PATENT DOCUMENTS

| | | | |
|---|---|---|---|
| 2004/0201348 A1* | 10/2004 | Anandan | 313/512 |
| 2005/0001545 A1 | 1/2005 | Aitken | |
| 2005/0099114 A1* | 5/2005 | Wu et al. | 313/504 |
| 2007/0045517 A1* | 3/2007 | Fukuyoshi et al. | 250/208.1 |

FOREIGN PATENT DOCUMENTS

| | | |
|---|---|---|
| CN | 1678138 A | 10/2005 |
| JP | 08-083579 | 3/1996 |
| KR | 1020060005369 A | 1/2006 |
| KR | 1020060025317 A | 3/2006 |
| WO | 2005/029394 A2 | 3/2005 |

OTHER PUBLICATIONS

Office Action issued in corresponding Chinese Patent Application No. 2007101110530; mailed Dec. 19, 2008.

Notice of Allowance issued in corresponding Korean Patent Application No. 10-2006-0061211, mailed Apr. 11, 2013, 6 pages.

* cited by examiner

ORGANIC ELECTRO-LUMINESCENCE DISPLAY DEVICE AND METHOD FOR FABRICATING THE SAME

This application claims the benefit of Korean Patent Application No. 2006-0061211, filed on Jun. 30, 2006, which is hereby incorporated by reference as if fully set forth herein.

BACKGROUND OF THE INVENTION

1. Field of the Invention

The present invention relates to an organic electro-luminescence display device, and more particularly, to an organic electro-luminescence display device having an improved reliability and an extended lifetime, and a method for fabricating the same.

2. Description of the Related Art

Organic electro-luminescence display devices display an image using light generated by the recombination of electrons and holes in an organic emission layer. Unlike liquid crystal display devices (LCDs), the organic electro-luminescence display devices require no backlight assembly because they display an image using light generated from the organic emission layer. Therefore, the organic electro-luminescence display devices are lightweight and slim and have low power consumption, wide viewing angle, and high contrast ratio. In addition, the organic electro-luminescence display devices can be driven at a low DC voltage and have a rapid response time. Since all components of the organic electro-luminescence display devices are formed of solid materials, the organic electro-luminescence display devices are robust against external impact. Moreover, the organic electro-luminescence display device can be used in a wide temperature range and manufactured at a low cost.

Meanwhile, an organic emission layer of a conventional organic electro-luminescence display device is susceptible to moisture and oxygen. Therefore, the organic emission layer is sealed using a sealing member so as to protect it from moisture and oxygen. Due to the moisture and oxygen, the organic emission layer is degraded and thus dark spots occur therein. The occurrence of the dark spots will reduce the lifetime of the organic electro-luminescence display device and degrade its reliability.

The sealing member contains ultraviolet (UV) curable resin that is cured by irradiation of UV light. The UV curable resin is an organic-based material and cannot effectively block external moisture and oxygen. Consequently, the lifetime and reliability of the organic electro-luminescence display device are significantly reduced and degraded in high-temperature and high-humidity environment.

SUMMARY OF THE INVENTION

Accordingly, the present invention is directed to an organic electro-luminescence display device and a method for fabricating the same that substantially obviate one or more problems due to limitations and disadvantages of the related art.

An object of the present invention is to provide an organic electro-luminescence display device that can effectively block external moisture and oxygen, whereby the reliability and lifetime of the organic electro-luminescence display device can be increased.

Another object of the present invention is to provide a method for fabricating the organic electro-luminescence display device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic electro-luminescence display device including: a first substrate; a second substrate disposed to face the first substrate; a display element disposed on at least one of the first and second substrates; and a frit glass disposed between the first substrate and the second substrate to seal the display element, the frit glass being cured by a light-heat converter.

In another embodiment of the present invention, there is provided a method for fabricating an organic electro-luminescence display device, including: preparing a first substrate; forming a display element on the first substrate; preparing a second substrate; coating a sealant in a periphery of the first or second substrate, and attaching the first substrate to the second substrate; and curing the sealant, the sealant containing a powder-type frit glass and a light-heat converter.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. In the drawings, the thicknesses of layers and regions are exaggerated for clarity. Wherever possible, the same reference numbers will be used throughout the drawings to refer to the same or like parts.

Figure 1:
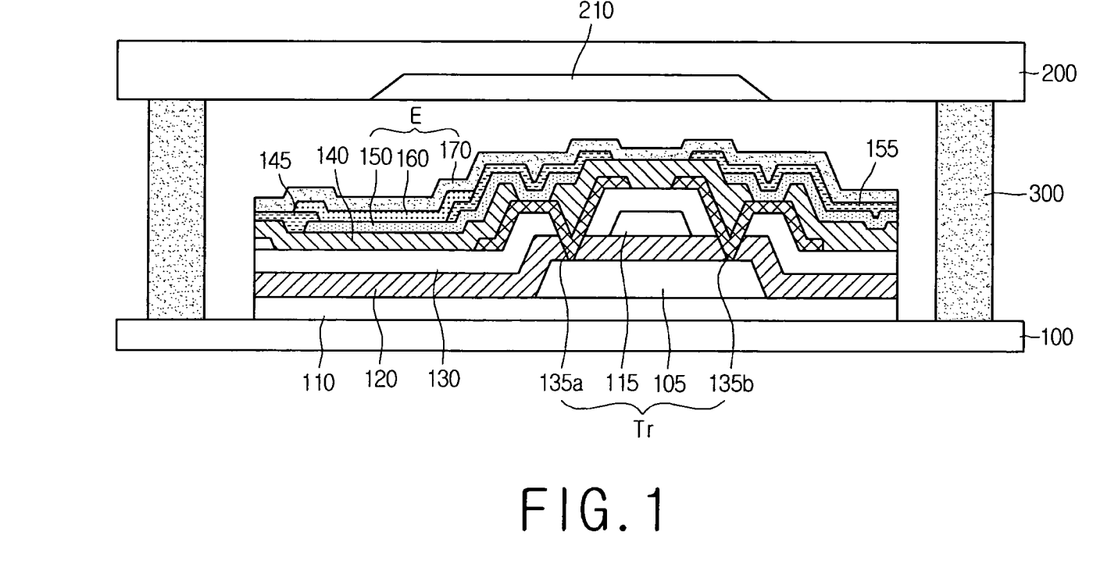
FIG. 1 is a cross-sectional view of an organic electro-luminescence display device according to a first embodiment of the present invention.

FIG. 1 is a cross-sectional view of an organic electro-luminescence display device according to a first embodiment of the present invention.

Referring to FIG. 1, an organic electro-luminescence display device according to a first embodiment of the present invention includes a first substrate 100 and a second substrate 200.

A TFT Tr and an organic electro-luminescent diode E are formed on a first substrate 100. The organic electro-luminescent diode E is electrically connected to the TFT Tr.

A buffer layer 110 is formed on the first substrate 100. A semiconductor layer 105 is formed on the buffer layer 110. The semiconductor layer 105 may be formed of polysilicon. A gate insulating layer 120 is formed over the first substrate 100 on which the semiconductor layer 105 is formed. A gate electrode 115 is formed above a portion of the gate insulating layer 110 corresponding to the semiconductor layer 105.

A source region and a drain region are defined in the semiconductor layer 105 by implanting impurities into the semiconductor layer 105 using the gate electrode 115 as a mask.

An interlayer insulating layer 130 is formed over the gate electrode 115 and the gate insulating layer 110. Source/drain electrodes 135a and 135b is formed on the interlayer insulating layer 130 to electrically connect to the source/drain regions of the semiconductor layer 105 through the interlayer insulating layer 130 and the gate insulating layer. In this way, the TFT Tr is formed on the first substrate 100.

A passivation layer 140 is formed over the first substrate 100 where the TFT Tr is formed, and an organic electro-luminescent diode E is formed on the passivation layer 140. The organic electro-luminescent diode E is electrically connected to the TFT Tr. The TFT Tr is electrically connected to a power line 155.

The organic electro-luminescent diode E includes a first electrode 150 electrically connected to the TFT Tr. The first electrode 150 may be formed by depositing a transparent conductive material and patterning the deposited transparent conductive material in each subpixel. The first electrode 150 may be formed of ITO or IZO.

Insulating layer patterns 145 having an opening exposing the subpixel are formed on the first electrode 150. The insulating layer patterns 145 may be formed of photoresist resin.

An organic electro-luminescent diode E is formed in the first substrate 100, and the second substrate 200 protects the organic electro-luminescent diode E from external moisture and oxygen. The second substrate 200 seals the organic electro-luminescent diode E.

A sealant 300 is formed in the periphery of the first substrate 100 or the second substrate 200. The first substrate 100 and the second substrate 200 are attached to each other by the sealant 300.

In this embodiment, the sealant 300 includes a frit glass cured using a light-heat converter. The frit glass effectively blocks external moisture and oxygen, thereby increasing the lifetime and reliability of the organic electro-luminescent diode E.

The light-heat converter converts light energy into heat energy.

Specifically, when light energy and heat are applied to the sealant containing the mixture of the powder-type frit glass and the light-heat converter, the light-heat converter converters the light energy into the heat energy and the converted heat energy is provided to the powder-type frit glass. Therefore, the time necessary to fabricate the frit glass can be reduced. In addition, the temperature necessary to fabricate the frit glass can be lowered.

The frit glass is fabricated by heating frit glass powder at more than about 400° C. and then cooling it. However, if the frit glass is fabricated at more than about 400° C., the organic electro-luminescent diode E may be thermally decomposed. However, the light-heat converter is added to the frit glass powder, the frit glass can be fabricated at a low temperature and a curing time of the frit glass can be significantly reduced.

The light-heat converter may be IR dye, carbon black, aluminum, or aluminum oxide, which converts light into heat.

The organic electro-luminescent diode E includes a first electrode 150, a second electrode 170, and an organic layer 160 interposed between the two electrodes 150 and 170.

The first electrode 150 is formed of a transparent conductive material, e.g., indium tin oxide (ITO) and indium zinc oxide (IZO), etc. The second electrode 170 may be formed of a material, e.g., aluminum and aluminum alloy, which has a work function lower than that of the first electrode 150.

In addition, the first substrate 100 includes a thin film transistor (TFT) Tr and the organic electro-luminescent diode E. The organic electro-luminescent diode E is electrically connected to the TFT Tr.

Specifically, the TFT Tr is electrically connected to the first electrode 150 of the organic electro-luminescent diode E. At this point, the first electrode 150 is patterned in each subpixel, and the second electrode 170 is electrically connected to the organic electro-luminescent diode E.

A moisture absorbent 210 may be provided inside the second substrate 200. The moisture absorbent 210 removes residual moisture and oxygen from a sealed space between the first substrate 150 and the second substrate 170.

FIGS. 2A to 2D are cross-sectional views illustrating a method for fabricating an organic electro-luminescence display device according to a first embodiment of the present invention.

Figure 2A:
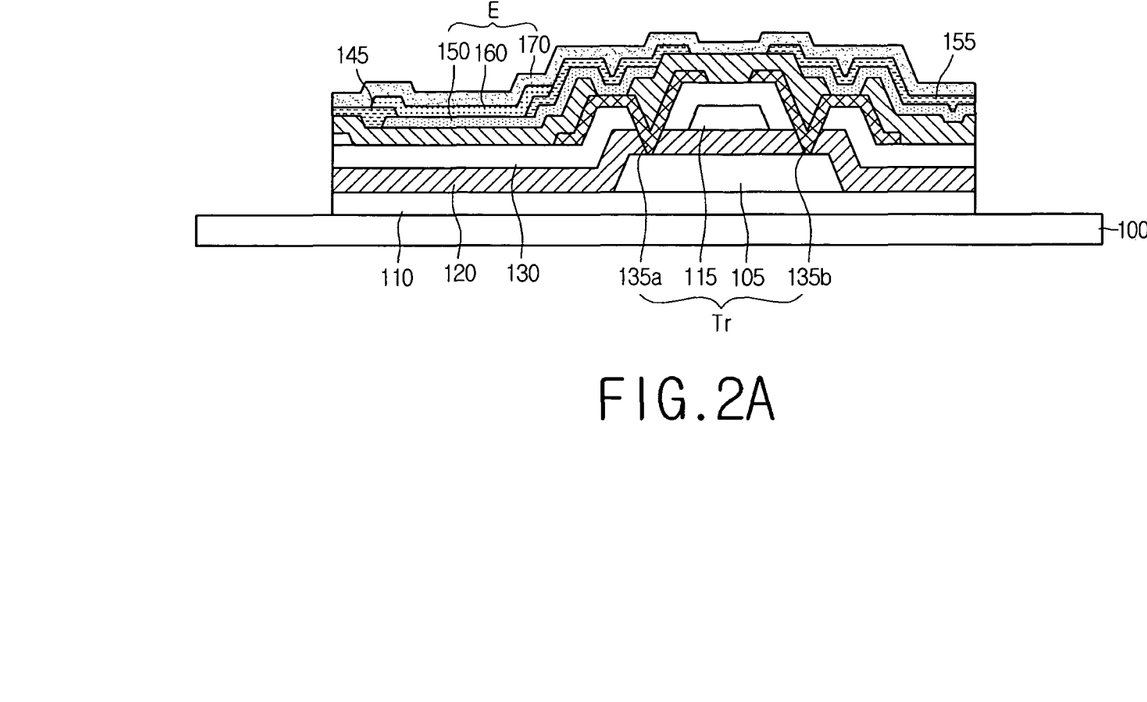
FIGS. 2A to 2D are cross-sectional views illustrating a method for fabricating an organic electro-luminescence display device according to a first embodiment of the present invention.

Referring to FIG. 2A, a TFT Tr and an organic electro-luminescent diode E are formed on a first substrate 100. The organic electro-luminescent diode E is electrically connected to the TFT Tr.

A buffer layer 110 is formed on the first substrate 100. A semiconductor layer 105 is formed on the buffer layer 110. The semiconductor layer 105 may be formed of polysilicon. A gate insulating layer 120 is formed over the first substrate 100 on which the semiconductor layer 105 is formed. A gate electrode 115 is formed above a portion of the gate insulating layer 120 corresponding to the semiconductor layer 105.

A source region and a drain region are defined in the semiconductor layer 105 by implanting impurities into the semiconductor layer 105 using the gate electrode 115 as a mask.

An interlayer insulating layer 130 is formed over the gate electrode 115 and the gate insulating layer 110. Source/drain electrodes 135a and 135b is formed on the interlayer insulating layer 130 to electrically connect to the source/drain regions of the semiconductor layer 105 through the interlayer insulating layer 130 and the gate insulating layer. In this way, the TFT Tr is formed on the first substrate 100.

A passivation layer 140 is formed over the first substrate 100 where the TFT Tr is formed, and an organic electro-luminescent diode E is formed on the passivation layer 140. The organic electro-luminescent diode E is electrically connected to the TFT Tr. The TFT Tr is electrically connected to a power line 155.

The organic electro-luminescent diode E includes a first electrode 150 electrically connected to the TFT Tr. The first electrode 150 may be formed by depositing a transparent conductive material and patterning the deposited transparent conductive material in each subpixel. The first electrode 150 may be formed of ITO or IZO.

Insulating layer patterns 145 having an opening exposing the subpixel are formed on the first electrode 150. The insulating layer patterns 145 may be formed of photoresist resin.

In each subpixel, an organic layer 160 is formed on the first electrode 150 exposed by the opening of the insulating layer patterns 145. The organic layer 160 may include a hole injection layer, a hole transport layer, a hole blocking layer, an electron transport layer, and an electron injection layer so as to increase the luminous efficiency of the organic emission layer 160.

A second electrode 170 is formed on the organic emission layer 160. The second electrode 170 is used as a common electrode. The second electrode 170 may be formed of a conductive material having a work function less than that of the first electrode 150. For example, the second electrode 170 may be formed of Al, Mg, or Ca. In this way, the organic electro-luminescent diode E electrically connected to the TFT Tr is formed.

Figure 2B:
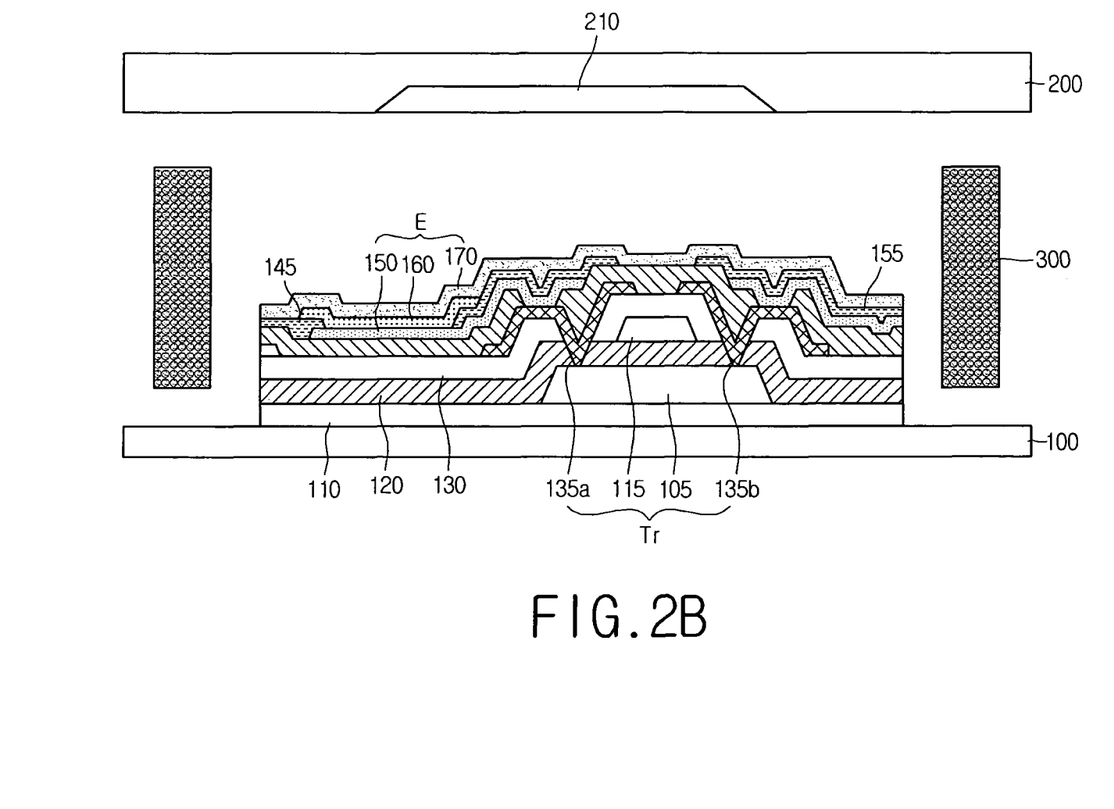

Referring to FIG. 2B, a second substrate 200 is prepared. A moisture absorbent 210 may be provided in an inside of the second substrate 200 to absorb oxygen and moisture.

A preliminary sealant is coated on the periphery of the first substrate 100 or the second substrate 200. The preliminary sealant includes a powder-type frit glass and a light-heat converter.

The light-heat converter converts light energy into heat energy and may be IR dye, carbon black, aluminum, or aluminum oxide.

Figure 2C:
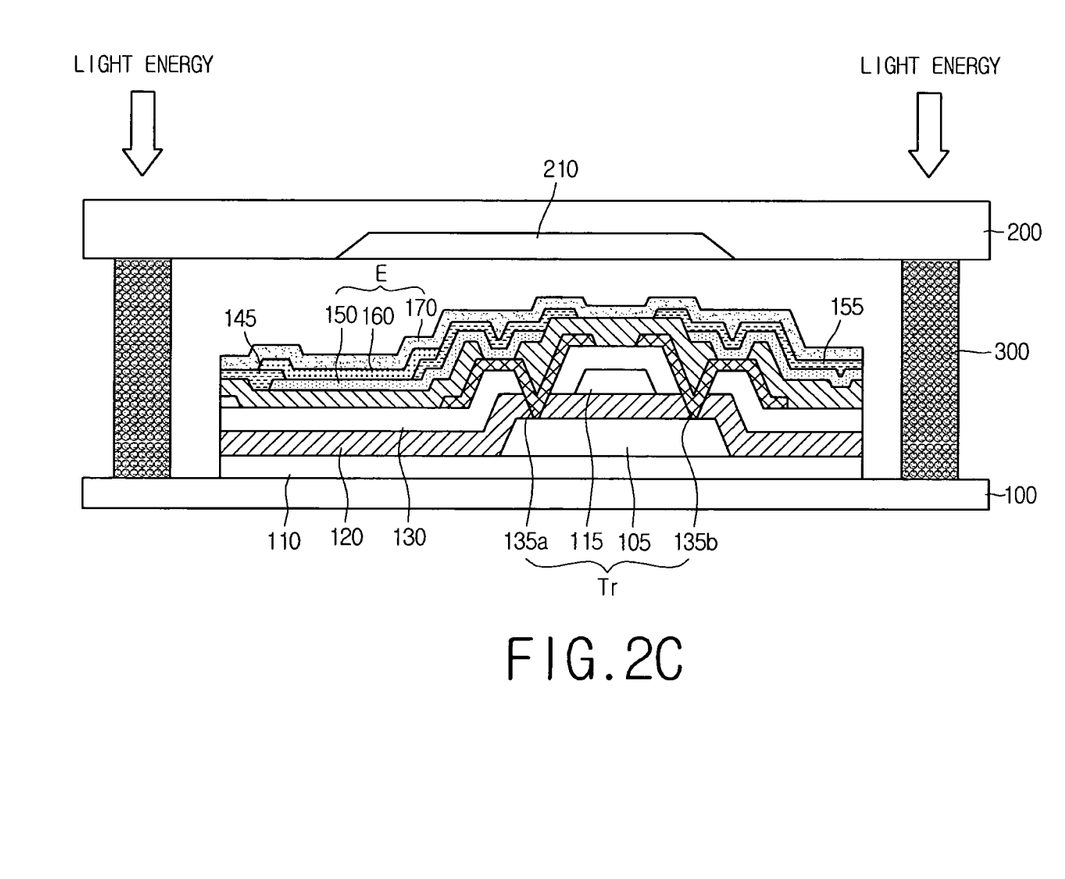

Referring to FIG. 2C, the first substrate 100 and the second substrate 200 are attached to each other by the preliminary sealant. Then, the preliminary sealant is cured by selectively applying light energy and heat to thereby form a sealant 300.

Specifically, the first substrate 100 and the second substrate 200 are attached to each other by the powder-type frit glass that is cured while being fused by the heat generated by the applied light energy and being cooled.

The light-heat converter uniformly mixed with the powder-type frit glass receives light energy to generate heat, whereby heat is uniformly supplied to the powder-type frit glass. Therefore, the curing time of the frit glass can be reduced and the heat can be uniformly supplied to the frit glass. Consequently, the frit glass is firmly cured, thereby reducing the moisture/air transmission rate.

The light energy may be provided through a laser or a beam heater. The laser or the beam heater selectively irradiates light energy onto the region where the sealant 300 is formed. Thus, heat is selectively transferred to the organic electro-luminescent diode E, thereby preventing the thermal decomposition of the organic electro-luminescent diode E.

The beam heater provides the sealant 300 with a beam having a wavelength of 0.1-200 μm at which the light-heat converter can be reacted. Since the beam heater irradiates a beam onto the sealant region in a line type or a rectangular type, the curing time of the sealant 300 can be reduced. Therefore, the time during which the organic electro-luminescent diode is exposed to the heat in the curing process of the sealant 300 is reduced, thereby preventing the thermal decomposition of the organic electro-luminescent diode E and the cracking of the first substrate 100 or the second substrate 200.

Figure 2D:
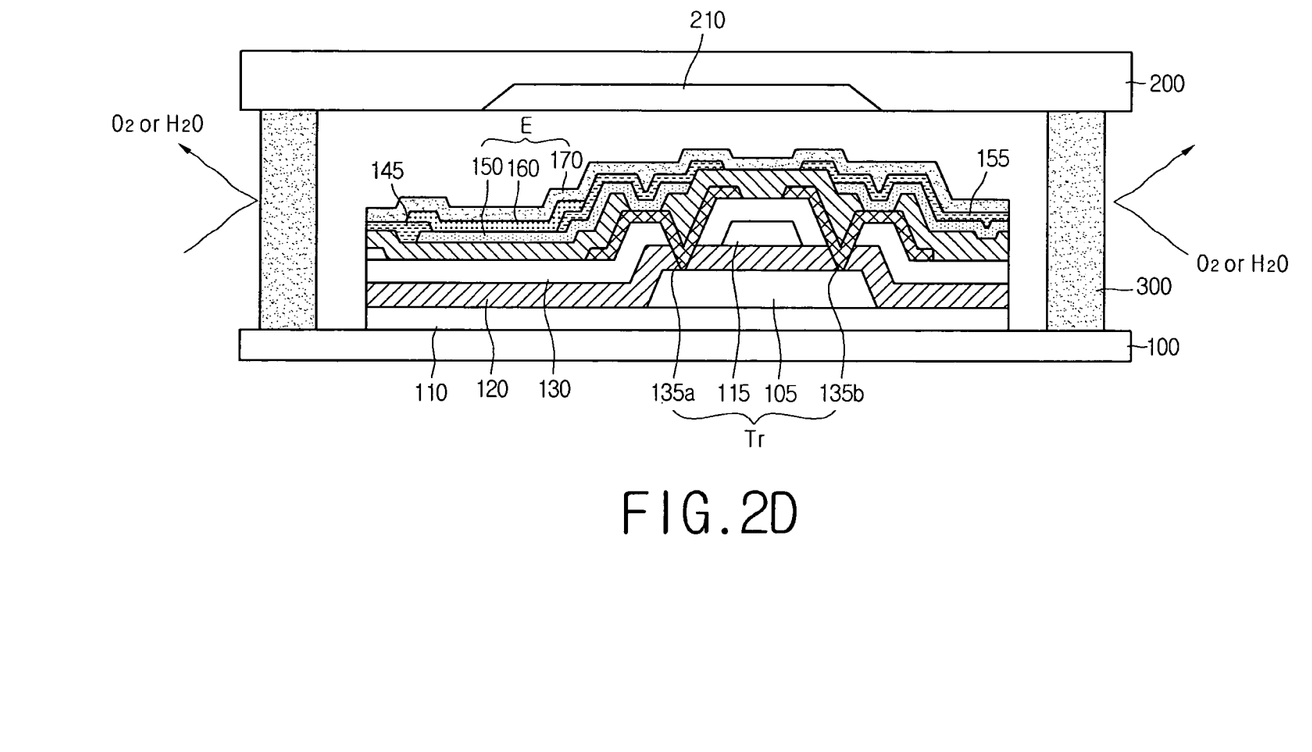

Referring to FIG. 2D, the sealant 300 is formed by the fusing and recrystallization of the powder-type frit glass. Therefore, the sealant 300 can protect the organic electro-luminescent diode E from external moisture or oxygen. That is, the organic electro-luminescent diode E can be prevented from being degraded due to the moisture and/or oxygen because the sealant 300 contains the frit glass having low moisture/oxygen transmission rate.

In addition, since the laser or the beam heater selectively irradiates light energy onto the region where the sealant 300 is formed, the organic electro-luminescent diode E can be prevented from being thermally decomposed by heat. Furthermore, The addition of the light-heat converter to the sealant 300 makes it possible to reduce the curing temperature and the curing time of the sealant 300 and cure the sealant 300 more firmly. Hence, the sealant 300 can perfectly block moisture and oxygen, thereby increasing the lifetime and reliability of the device.

Figure 3:
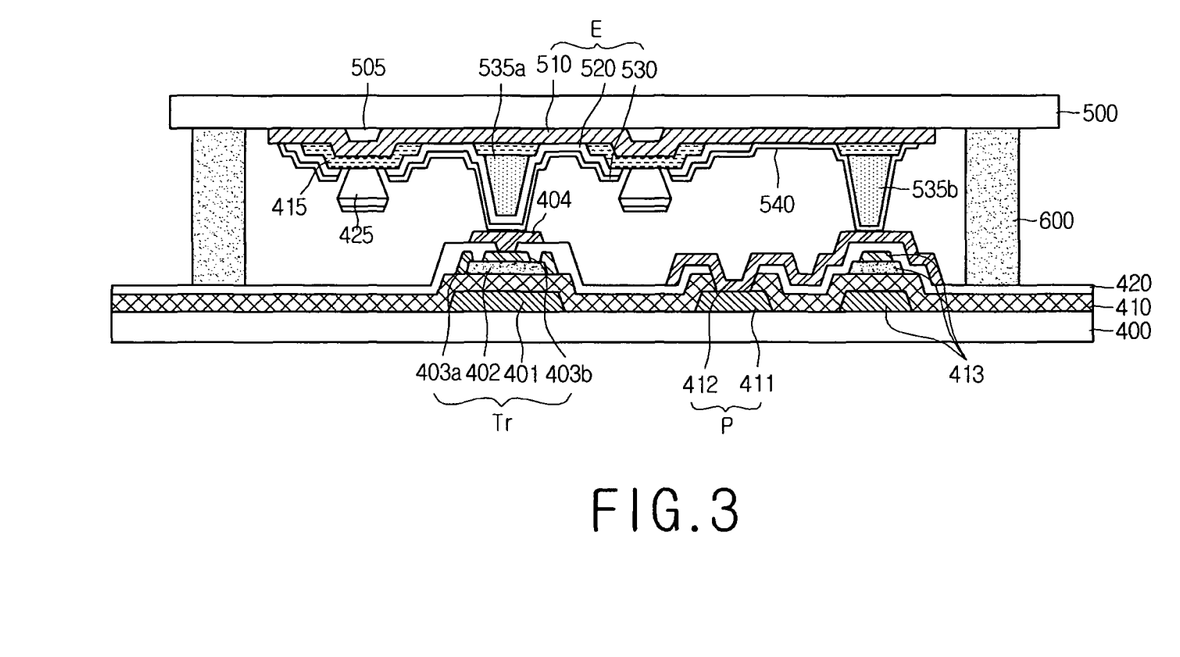
FIG. 3 is a cross-sectional view of an organic electro-luminescence display device according to a second embodiment of the present invention.

FIG. 3 is a cross-sectional view of an organic electro-luminescence display device according to a second embodiment of the present invention. Since the organic electro-luminescence display device of FIG. 3 is similar to that of FIG. 1, except that a TFT and an organic electro-luminescent diode E are formed in the different substrates, a duplicate description will be omitted for conciseness.

Referring to FIG. 3, the organic electro-luminescence display device according to the second embodiment of the present invention includes first and second substrates 400 and 500 spaced apart from each other by a predetermined distance and attached to each other by a sealant 600. A TFT Tr is formed on the first substrate 400, and an organic electro-luminescent diode E is formed on the second substrate 500.

Since it is difficult to separately form a moisture absorbent in such a dual panel type organic electro-luminescence display device, an encapsulation process of attaching the first substrate 400 to the second substrate 500 is required.

The sealant 600 includes a frit glass made using a light-heat converter. Since the sealant 600 having the frit glass has a moisture/oxygen transmission rate lower than that of a related art sealant, the lifetime and reliability of the organic electro-luminescent diode E can be significantly increased.

The light-heat converter may be IR dye, carbon black, aluminum, or aluminum oxide, which converts light energy into heat energy. The light-heat converter can reduce the temperature and time necessary to cure the sealant 600. Therefore, the organic electro-luminescent diode E can be prevented from being thermally decomposed when the sealant 600 is cured.

Meanwhile, a plurality of gate lines and a plurality of data lines are crossed to one another over the first substrate 400. The TFT Tr is disposed in a subpixel defined by the crossing of the two lines. The TFT Tr includes a gate electrode 401, a semiconductor layer 402, and source/drain electrodes 403a and 403b.

Characteristics of the TFT Tr can be improved by increasing a channel length of the TFT Tr, i.e., a length between the source electrode 403a and the drain electrode 403b.

A passivation layer 420 is formed over the first substrate 400 where the TFT Tr is formed. A connection electrode 404 is formed on the passivation layer 420 to contact the drain electrode 403b of the TFT Tr. The TFT Tr is electrically connected to the organic electro-luminescent diode E through the connection electrode 404. That is, the TFT Tr is electrically connected to a second electrode 530 of the organic electro-luminescent diode E.

A common voltage pad P is formed on the first substrate 400 to receive a common voltage from an external circuit and provide the received common voltage to the organic electro-luminescent diode E. The common voltage pad P includes a power electrode 411 and a power contact electrode 412. The power electrode 411 is electrically connected to a common voltage line formed in the first substrate 400, and the power contact electrode 412 is formed on the power electrode 411 and electrically connected to a first electrode 510 of the organic electro-luminescent diode E.

A dummy pattern 413 is formed between the power electrode 411 and the power contact electrode 412. The dummy pattern 413 has the same height difference as that of the TFT Tr.

An organic electro-luminescent diode E including a first electrode 510, an organic emission layer 520, and a second electrode 530 is formed under the second substrate 500.

The first electrode 510 is formed under the second substrate 500. The first electrode 510 acts as a common electrode and may be formed of a transparent conductive material, e.g., indium tin oxide (ITO) or indium zinc oxide (IZO).

An auxiliary electrode 505 may be further formed between the second substrate 500 and the first electrode 510. The auxiliary electrode 505 reduces the resistance of the first electrode 510. At this point, the auxiliary electrode 505 is formed of a low-resistance metal and is mostly opaque. Therefore, the auxiliary electrode 505 is preferably formed at a region corresponding to a non-emission region.

At least one of a hole injection layer (HIL), a hole transport layer (HTL), a hole blocking layer (HBL), an electron transport layer (ETL), and an electron injection layer (EIL) may be further formed under or above the organic emission layer 520.

Therefore, electrons and holes can be more readily injected into the organic emission layer 520 because energy levels can be appropriately adjusted at boundaries of the first electrode 510, the organic emission layer 520, and the second electrode 530. Hence, the luminous efficiency of the organic electro-luminescence display device can be significantly improved.

The second electrode 530 is formed to surround the periphery of a first spacer 535a that constantly maintains a cell gap between the first substrate 400 and the second substrate 500. Due to the first spacer 535a, a portion of the second electrode 530 protrudes toward the first substrate 400. The protruding second electrode 530 contacts the connection electrode 404. In addition, the second electrode 530 is automatically patterned in each subpixel by a separator 425 disposed on a buffer layer 415 formed in the periphery of the subpixel.

The organic electro-luminescence display device further includes a second spacer 535b having the same height as the first spacer 535a. The second spacer 535b is formed in a region corresponding to the region where the power contact electrode 412 is formed. At this point, a second electrode dummy pattern 540 separated from the second electrode 530 is formed to surround the second spacer 535b. The second electrode dummy pattern 540 surrounding the second spacer 535b contacts the power contact electrode 412. The second electrode dummy pattern 540 separated from the second electrode 530 is electrically connected to the first electrode 510. The first electrode 510 and the power contact electrode 412 are electrically connected by the second spacer 535b, so that the common voltage can be applied to the first electrode 510.

FIGS. 4A to 4D are cross-sectional views illustrating a method for fabricating a method for fabricating an organic electro-luminescence display device according to a second embodiment of the present invention.

Figure 4A:
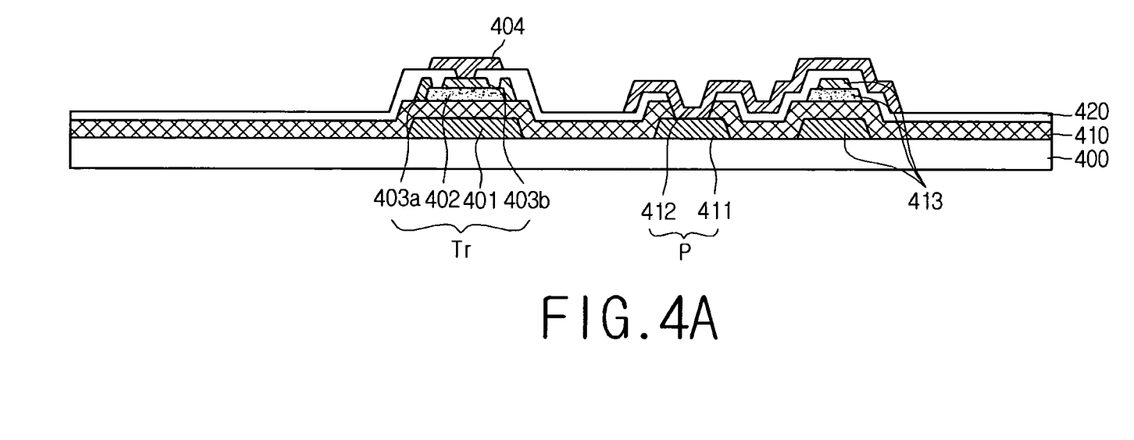
FIGS. 4A to 4D are cross-sectional views illustrating a method for fabricating a method for fabricating an organic electro-luminescence display device according to a second embodiment of the present invention.

Referring to FIG. 4A, a first substrate 400 is prepared, and a TFT Tr is formed on the first substrate 400.

Specifically, a conductive layer is formed on the first substrate 400 and is patterned to form a gate line (not shown) and a gate electrode 401. At this point, the gate line is formed in one direction and the gate electrode 401 is branched from the gate line. Simultaneously, a power electrode 411 may be formed such that it receives a common voltage from an external signal and applies the received common voltage to an organic electro-luminescent diode, which will be described later. In addition, a first dummy pattern 413a is formed spaced apart from the power electrode 411 by a predetermined distance.

A gate insulating layer 410 is formed over the first substrate 400 where the gate electrode 401 is formed. The gate insulating layer 410 may be formed using a silicon oxide layer, a silicon nitride layer, or a stacked layer thereof, which is deposited by a chemical vapor deposition (CVD) process.

A semiconductor layer 402 corresponding to the gate electrode 401 is formed on the gate insulating layer 410. Simultaneously, a second dummy pattern 413b corresponding to the first dummy pattern 413a may be further formed on the gate insulating layer 410.

A first conductive layer (not shown) is formed on the semiconductor layer 402 and the gate insulating layer 410 and is patterned to form a data line (not shown) crossing the gate line (not shown). Simultaneously, a drain electrode 403b is formed on a center portion of the semiconductor layer 402, and a source electrode 403a is formed in an annular shape to surround the periphery of the drain electrode 403b. Therefore, characteristics of a TFT Tr can be improved by increasing a channel region of the TFT Tr, i.e., an area corresponding to the source electrode 403a and the drain electrode 403b. In addition, a third dummy pattern 413c may be further formed on the second dummy pattern 413b.

In this way, the TFT Tr including the gate electrode 401, the semiconductor layer 402 and the source/drain electrodes 403a and 403b is formed.

A passivation layer 420 is formed on the gate insulating layer 410 and the TFT Tr. The passivation layer 420 may be formed using an organic layer or an inorganic layer. For example, the organic layer may be acryl-based resin, benzocylco-butene (BCB), polyimide (PI), or Novolac resin, and the inorganic layer may be a silicon oxide layer, a silicon nitride layer, or a stacked layer thereof.

Contact holes are formed in the passivation layer 420 to expose portions of the drain electrode 403b and the power electrode 411.

A conductive layer is formed on the passivation layer 420 with the contact holes and is patterned to form a connection electrode 404 electrically connected to the drain electrode 403b. Simultaneously, a power contact electrode 412 may be formed. The power contact electrode 412 is disposed on the first to third dummy patterns 413a, 413b and 413c, such that it has the same height difference as that of the connection electrode 404.

Figure 4B:
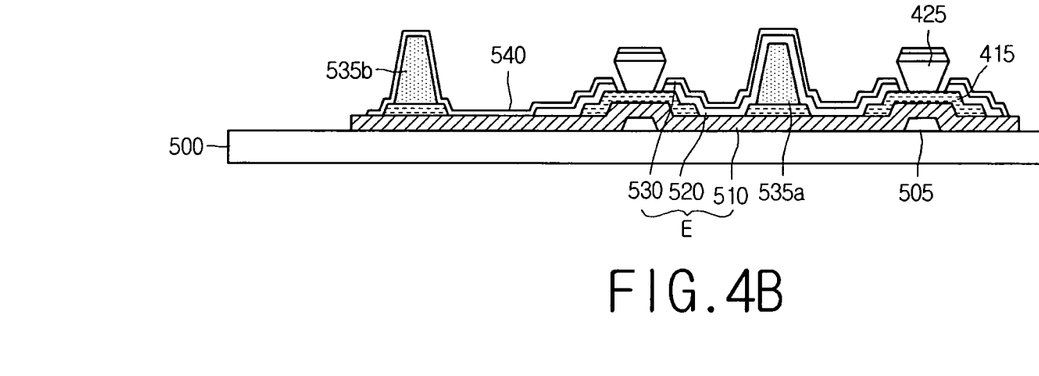

Referring to FIG. 4B, a second substrate 500 where an organic electro-luminescent diode E is formed is prepared.

Specifically, the second substrate 500 is prepared, and a first electrode 510 is formed as a common electrode on the second substrate 500. The first electrode 510 is formed of a transparent conductive material having a high work function. For example, the first electrode 510 may be formed of ITO or IZO.

A buffer layer 515 is formed to define pixel regions on the first electrode 510. The buffer layer 515 is formed of an insulating layer. A separator 525 is formed on the buffer layer 515. The separator 525 may be formed in a shape of a reversely tapered partition wall. The separator 525 may be formed of an organic insulating material. In addition, an island-shaped buffer layer 515 is further formed in the subpixel, and a first spacer 535a is formed on the buffer layer 515. Simultaneously, a second separator 535b is formed to have the same height as that of the first spacer 535a.

An organic emission layer 520 and a second electrode 530 are sequentially formed over the first spacer 535a and the first electrode 510. The second electrode 530 is automatically separated in each subpixel by the separator 525. In addition, because the second electrode 530 extends over the first spacer 535a, a portion of the second electrode 530 protrudes upwards due to the first spacer 535a. At the same time, a second electrode dummy pattern 540 separated from the second electrode 530 is formed to surround the second spacer 535b. The second electrode dummy pattern 540 also protrudes upwards. The second electrode dummy pattern 540 is electrically connected to the first electrode 510.

Before forming the organic emission layer 520, a hole injection layer and/or a hole transport layer may be further formed. In addition, after forming the organic emission layer 520, at least one of a hole blocking layer, an electrode transport layer and an electrode injection layer may be further formed.

Figure 4C:
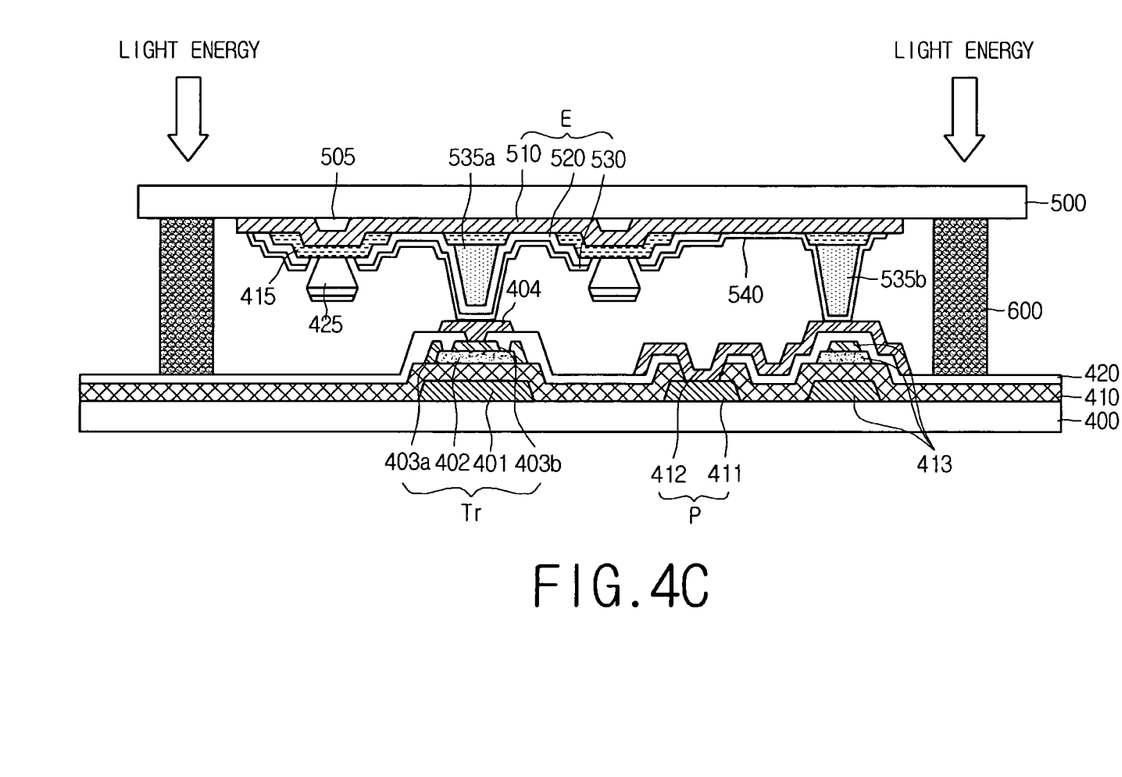
Figure 4D:
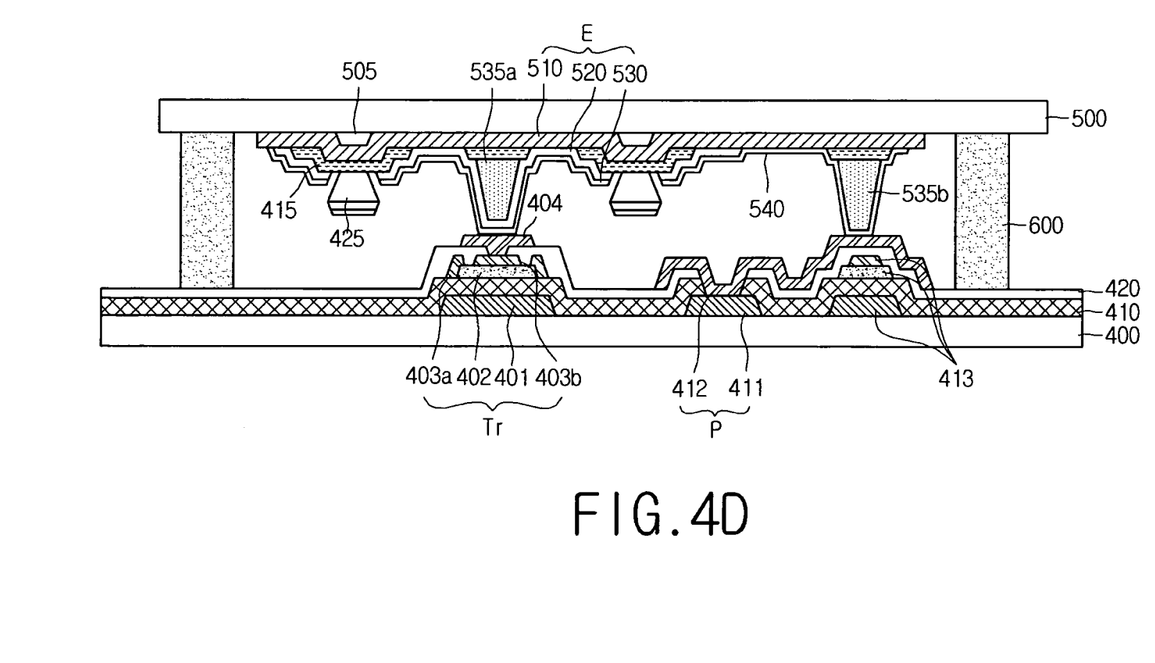

Referring to FIG. 4C, a sealant 600 is coated on the first substrate 400 where the TFT Tr is formed or the second substrate 500 where the organic electro-luminescent diode E is formed. The sealant 600 contains a frit glass and a light-heat converter. The light-heat converter may be at least one of IR dye, carbon black, aluminum, or aluminum oxide, which converts light energy into heat energy.

Then, the first and second substrates 400 and 500 are aligned such that the TFT Tr and the common voltage pad P formed in the first substrate 400 electrically contact the organic electro-luminescent diode E. That is, the connection electrode 404 contacts the second electrode 530 protruded by the first spacer 535a. In addition, the power contact electrode 412 corresponding to the dummy pattern 413 electrically contacts the second electrode dummy pattern 540 protruded by the second spacer 535b.

The sealant 600 is cured by irradiating light energy onto the region where the sealant 600 is formed, and the first substrate 400 and the second substrate 500 are attached to each other such that the organic electro-luminescent diode is sealed.

A laser or a beam heater may be used to provide light energy only to the region where the sealant 600 is formed. The beam heater may have a wavelength ranging from about 0.1 μm to about 200 μm.

In this way, the first substrate 400 and the second substrate 500 are attached to each other using the frit glass having low moisture/oxygen transmission rate. Since the light-heat converter is added to the sealant 600, the curing time and the curing temperature of the frit glass can be reduced. Moreover, the curing degree of the frit glass can be increased, thereby further reducing the moisture or oxygen transmission rate.

Therefore, the lifetime and reliability of the organic electro-luminescence display device can be increased by preventing the degradation of the organic electro-luminescence display device and protecting against external oxygen or moisture.

When the substrate where the TFT and the organic electro-luminescent diode are formed is attached to a separate encapsulation substrate, the yield of the organic electro-luminescence display device is determined by the product of the yield of the TFT and the yield of the organic electro-luminescent diode. Therefore, the total yield is greatly dependent on the process of forming the organic electro-luminescent diode, which is performed at a later stage. However, the second embodiment of the present invention can expect the reduced defection rate and the increased production yield by forming the TFT and the organic electro-luminescent diode on the different substrates and attaching the two substrates.

As described above, the lifetime and reliability of the organic electro-luminescence display device can be increased by performing the encapsulation process using the frit glass having low moisture/oxygen transmission rate.

In addition, since the light-heat converter is added to the frit glass, the curing temperature and the curing time can be reduced, thereby preventing the degradation of the organic electro-luminescence display device.

Furthermore, since the light energy is irradiated only onto the region where the sealant is formed, the organic electro-luminescent diode can be prevented from being degraded due to heat transferred thereto.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro-luminescence display device comprising:
    a first substrate;
    a second substrate opposite to the first substrate;
    a display element disposed on the first substrate;
    a moisture absorbent formed on the second substrate;
    a thin film transistor disposed on the first substrate and under the moisture absorbent; and
    a sealant formed adjacent the periphery of the first substrate and of the second substrate, wherein the sealant includes a mixture of a powder-type frit glass and at least one of IR dye and carbon black,
    wherein the frit glass is disposed between the first substrate and the second substrate and is cured by heat generated by the at least one of the IR dye and the carbon black,
    wherein the at least one of the IR dye and the carbon black is uniformly mixed with the powder-type frit glass in the sealant and receives and converts a light energy to heat energy and uniformly supplies the heat energy to the frit glass, thereby reducing a curing time of the frit glass;
    wherein the moisture absorbent removes residual moisture and oxygen from a sealed space between the first substrate and the second substrate,
    wherein the display element comprises first and second electrodes disposed on the first substrate and having different work functions, an organic layer disposed between the first electrode and the second electrode and having an organic emission layer, and insulating layer patterns having an opening exposing the sub-pixel and disposed on the first electrode,
    wherein the insulating layer patterns are formed of photoresist resin.

2. The organic electro-luminescence display device according to claim 1, wherein the first electrode is formed by depositing a transparent conductive material and patterned the deposited transparent conductive material in each sub-pixel.

3. The organic electro-luminescence display device according to claim 1, wherein at least two first electrodes are provided on the first substrate in a matrix form.

4. A method for fabricating an organic electro-luminescence display device, comprising:
    preparing a first substrate;
    forming a display element on the first substrate;
    preparing a second substrate;
    forming a moisture absorbent on the second substrate;
    forming a thin film transistor on the first substrate and under the moisture absorbent;
    uniformly mixing a powder-type frit glass with at least one of IR dye and carbon black to form a mixture of the powder-type frit glass and the at least one of IR dye and the carbon black;

coating the mixture of the powder-type frit glass and the at least one of the IR dye and the carbon black in a periphery of the first or second substrate;

attaching the first substrate to the second substrate;

irradiating light energy to the mixture of the powder-type frit glass and the at least one of the IR dye and the carbon black such that the at least one of the IR dye and the carbon black converts the light energy into heat energy;

curing the powder-type frit glass by using the heat energy generated by the at least one of IR dye and carbon black;

wherein the moisture absorbent removes residual moisture and oxygen from a sealed space between the first substrate and the second substrate;

wherein the display element comprises first and second electrodes disposed on one of the first and second substrates having different work functions and an organic layer disposed between the first electrode and the second electrode and having an organic emission layer.

5. The method according to claim 4, wherein the display element is formed on the first substrate, the display element further comprises insulating layer patterns having an opening exposing the sub-pixel and disposed on the first electrode connected to the thin film transistor.

6. The method according to claim 4, wherein the at least one of the IR dye and the carbon black is uniformly mixed with the powder-type frit glass in the sealant and uniformly supplies the heat energy to the frit glass, thereby reducing a curing temperature of the frit glass.

7. The method according to claim 4, wherein the first substrate and the second substrate are attached to each other by the powder-type frit glass that is cured while being fused by the heat generated by the applied light energy and being cooled.

8. The method according to claim 4, wherein the light energy is provided only to the mixture of the powder-type frit glass and the at least one of the IR dye and the carbon black.

9. The method according to claim 8, wherein the light energy is provided only to the mixture of the powder-type frit glass and the at least one of the IR dye and the carbon black, thereby avoiding the display element thermally decomposed.

10. The method according to claim 8, wherein a beam heater is used to provide light energy only to the region where the mixture of the powder-type frit glass and the at least one of the IR dye and the carbon black is formed, and wherein the beam heater is a line type or a rectangular type.

* * * * *